US012315592B2

(12) United States Patent
Mitsubori et al.

(10) Patent No.: US 12,315,592 B2
(45) Date of Patent: May 27, 2025

(54) APPARATUSES FOR TIMING CONTROL IN WRITE PATH

(71) Applicant: Micron Technology, Inc., Boise, ID (US)

(72) Inventors: Shingo Mitsubori, Tokyo (JP); Ryo Fujimaki, Kanagawa (JP); Yutaka Uemura, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 343 days.

(21) Appl. No.: 17/860,064

(22) Filed: Jul. 7, 2022

(65) Prior Publication Data

US 2024/0013823 A1 Jan. 11, 2024

(51) Int. Cl.
*G11C 7/22* (2006.01)
*G11C 7/10* (2006.01)

(52) U.S. Cl.
CPC ............ *G11C 7/222* (2013.01); *G11C 7/1039* (2013.01); *G11C 7/1045* (2013.01); *G11C 7/1093* (2013.01); *G11C 2207/229* (2013.01)

(58) Field of Classification Search
CPC ..... G11C 7/222; G11C 7/1039; G11C 7/1045; G11C 7/1093; G11C 2207/229; G11C 2207/2272; G11C 7/22; G11C 16/32; G11C 16/08; G11C 16/10
See application file for complete search history.

(56) References Cited

U.S. PATENT DOCUMENTS

2017/0140808 A1* 5/2017 Jung .................. G11C 11/4093
2021/0405927 A1* 12/2021 Oh ...................... G11C 7/1069

* cited by examiner

*Primary Examiner* — Donald H B Braswell
(74) *Attorney, Agent, or Firm* — Dorsey & Whitney LLP

(57) ABSTRACT

Apparatuses for timing control in a write path are disclosed. An example apparatus includes: a clock input circuit that receives a clock signal and provides an internal clock signal; a command decoder that receives command signals and the internal clock signal, and provides an active write command signal when the command signals indicates a write operation; a write latency shifter that receives the write command signal, a latency value and a WICA value, adjusts timing of the write command signal responsive to the latency value and the WICA value, and provides a shifted write command signal; and a write DLL including a delay line that receives the shifted write command signal and provides a delayed write command signal. The write DLL provides the WICA value to set a propagation time from the clock input circuit to the write DLL to be a multiple of a period of the clock signal.

18 Claims, 8 Drawing Sheets

APPARATUSES FOR TIMING CONTROL IN WRITE PATH

BACKGROUND

High data reliability, high speed memory access, lower power consumption and reduced chip size are features that are demanded from semiconductor memory. To achieve higher memory access speed, operational timing in the semiconductor memory is adjusted using a clock signal (CK) and a data queue strobe signal (DQS) as reference signals.

Recent semiconductor memory includes fly-by topology layouts of commands, addresses, control signals, and timing signals, including the clock signal and the data queue strobe signal for writing data entering into memory chips. A fly-by topology layout includes fewer stubs with reduced lengths, causing less noise. However, the fly-by topology layout may cause time skews in the clock signal and the data queue strobe signal. To address the skew issues, write level training may be performed.

A flow of the write level training may include external write leveling and internal write leveling. The external write leveling of the semiconductor memory allows a memory controller outside the semiconductor memory to compensate a difference in delays due to misalignment between external clock and DQS pins. In order to perform the external write leveling, a delay that is equivalent to a command path is provided on a path for DQS.

The internal write leveling of the semiconductor memory compensates a difference in internal delays between the clock signal and the data queue strobe signal within the semiconductor memory. The semiconductor memory provides a programmable delay setting including a write leveling internal cycle alignment (WICA) that may be performed by the memory controller. A WICA value stored in a mode register is specific to each device, its write preamble setting, and the operating frequency being used. The memory controller may control delays in a write path to align with a CAS write latency (CWL) delay after a write command instructing a write operation using the write level training and the WICA value. During the internal write leveling, the delay equivalent to the command path is omitted from the path for DQS.

During the internal write leveling, the WICA setting is calculated by rounding up time delays and start up time by a cycle of the clock signal. Thus, fine adjustment of DQS calculated merely using the WICA value may be affected and a maximum difference of the fine adjustment may be in a range of one clock cycle. Thus a better calculation of the fine adjustment of DQS to improve an offset of the DQS may be desired.

DETAILED DESCRIPTION

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

A write forward path includes a CWL shifter and a write delay-locked loop coupled to the CWL shifter. The write delay-locked loop provides WICA information for write level internal cycle alignment between a clock signal and a DQS signal while providing a signal indicating a start timing of a write operation from the CWL shifter with a delay controlled based on a phase difference between the clock signal and a feedback signal from a replica circuit. The write delay-locked loop actively controls its delay on the write forward path in a manner that a total propagation time of the write forward path from an input node of a clock input circuit to an output node of the write delay-locked loop becomes an integral multiple of a clock period. As a result, a time offset of the data strobe signal tDQSoffset may be controlled within a desirable range, and alignment between a clock signal and a DQS signal in a write path may be improved.

Figure 1:
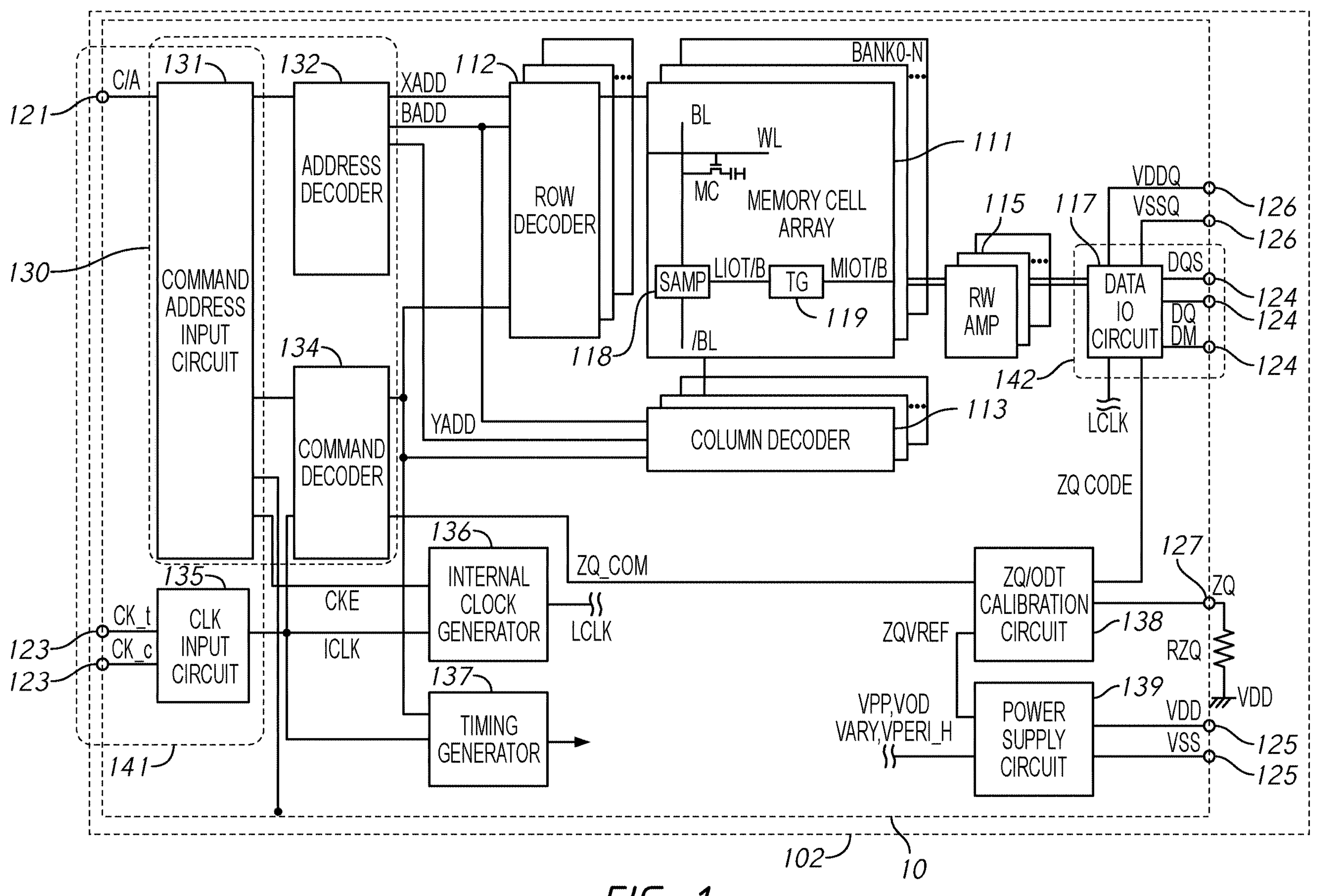
FIG. 1 is a block diagram of a semiconductor device, according to an embodiment of the present disclosure.

FIG. 1 is a block diagram of a semiconductor device 10 in accordance with one embodiment of the present disclosure. The semiconductor device 10 may be a dynamic random-access memory (DRAM), such as a double data rate SDRAM integrated into a single semiconductor chip, for example. The semiconductor device 10 may be mounted on an external substrate 102, for example, a memory module substrate, a mother board or the like.

As shown in FIG. 1, the semiconductor device 10 includes a memory cell array 111. The memory cell array 111 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 112 and the selection of the bit line BL is performed by a column decoder 113. Sense amplifiers 118 are coupled to corresponding bit lines BL and connected to local I/O line pairs LIOT/B. Local IO line pairs LIOT/B are connected to main IO line pairs MIOT/B via transfer gates TG which function as selector circuits.

Turning to the explanation of a plurality of external terminals included in the semiconductor device 10, the plurality of external terminals includes command/address terminals 121, clock terminals 123, data terminals 124, power supply terminals 125 and 126, and a calibration terminal ZQ 127. An input signal block 141 may include the command/address terminals 121. The command/address terminals 121 and signal lines coupled to the command/address terminal 121 may include a first set of terminals and signal lines that are configured to receive the command signals and a separate, second set of terminals and signal lines that configured to receive the address signals, in some examples. In other examples, the terminals 121 and signal lines associated with command/address terminals 121 the may include common terminals and signal lines that are configured to receive both command signal and address signals. The input signal block 141 may include the clock terminals 123 which include input buffers. A data interface block 142 includes the data terminals 124 that will be later described, according to one embodiment. The data terminals 124 may be coupled to output buffers for read operations of memories. Alternatively, the data terminals 124 may be coupled to input buffers for read/write access of the memories. FIG. 1 shows an example of dynamic random access memory (DRAM), however, any device having external terminals for signal input/output may be included as the external terminals of embodiments of the present disclosure. Each terminal of the plurality of external terminals may include a pad. A plurality of pads in the plurality of external terminals 124 will be explained below in detail.

The semiconductor device 10 includes a command/address circuit 130. In some embodiments, the command/address circuit 130 may include a command/address input circuit 131, an address decoder 132 and a command decoder 134. The command/address input circuit 131 may receive an address signal ADD and a bank address signal BADD from the command/address terminals 121, and transmit the address signal ADD and the bank address signal BADD to the address decoder 132. The address decoder 132 may decode the address signal ADD and provide a decoded row address signal XADD to the row decoder 112, and a decoded column address signal YADD to the column decoder 113. The address decoder 132 also may also receive the bank address signal BADD and provide the bank address signal BADD to the row decoder 112 and the column decoder 113.

The command/address input circuit 131 may receive a command signal from outside, such as, for example, a memory controller, at the command/address terminals 121. The command/address input circuit 131 may provide the command signal to the command decoder 134. The command decoder 134 may decode the command signal and generate various internal command signals. The internal command signals may be used to control operation and timing of various circuits of the semiconductor device 10. For example, the internal command signals may include a row command signal, such as an active command, to select a word line and a column command signal, such as a read command or a write command, to select a bit line, and a calibration signal ZQ_COM to a ZQ calibration circuit 138.

Accordingly, when an active command is issued with a row address and a column address is timely supplied with a read command, read data is read from a memory cell MC in the memory cell array 111 designated by these row address and column address. The read data DQ is output externally from the data terminals 124 via a read/write amplifier 115 and a data input/output circuit 117. When the write command is issued and a column address is timely supplied with this command, and then write data DQ is supplied to the data terminals 124 in synchronization with a data strobe signal DQS while a data mask signal DM allowing masking of invalid write data is not active. The write data DQ is supplied via the data input/output circuit 117 and the read/write amplifier 115 to the memory cell array 111 and written in the memory cell MC designated by the row address and the column address.

The clock terminals 123 are supplied with external clock signals CK_t and CK_c, respectively. These external clock signals CK_t and CK_c are complementary to each other and are supplied to a clock input circuit 135. The clock input circuit 135 receives the external clock signals CK_t and CK_c and generates an internal clock signal ICLK. The internal clock signal ICLK is supplied to an internal clock generator 136 and thus a phase controlled internal clock signal LCLK is generated based on the received internal clock signal ICLK and a clock enable signal CKE from the command/address input circuit 131. The phase controlled internal clock signal LCLK is supplied to the data input/output circuit 117 and is used as a timing signal for determining an output timing of the read data DQ. The internal clock signal ICLK is also supplied to a timing generator 137 and thus various internal clock signals can be generated.

The power supply terminals 125 are supplied with power supply potentials VDD and VSS. These power supply potentials VDD and VSS are supplied to an internal power supply circuit 139. The internal power supply circuit 139 generates various internal potentials, for example, VPP, VOD, VARY, VPERI, and a reference potential ZQVREF based on the power supply potentials VDD and VSS. The internal potential VPP is mainly used in the row decoder 112, the internal potentials VOD and VARY are mainly used in the sense amplifiers 118 included in the memory cell array 111, and the internal potential VPERI may be used in many other circuit blocks in a peripheral region outside the memory cell array 111. The reference potential ZQVREF is used in the ZQ calibration circuit 138.

The power supply terminals 126 are supplied with power supply potentials VDDQ and VSSQ. These power supply potentials VDDQ and VSSQ are supplied to the data input/output circuit 117. The power supply potentials VDDQ and VSSQ may be the same potentials as the power supply potentials VDD and VSS that are supplied to the power supply terminals 125, respectively. However, the power supply potentials VDDQ and VSSQ may be used for the data input/output circuit 117 so that power supply noise generated by the input/output circuit 117 does not propagate to the other circuit blocks.

The calibration terminal ZQ 127 is connected to the calibration circuit 138. The calibration terminal ZQ 127 is also connected to an external resistor RzQ included in the external substrate 102. The ZQ calibration circuit 138 performs a calibration operation with reference to an impedance of the external resistance RzQ and the reference potential ZQVREF responsive to the calibration signal ZQ_COM, and provide an impedance code ZQCODE may be provided by the calibration operation, thus impedances of input buffers and output buffers in the data input/output circuit 117 can be adjusted.

Figure 2:
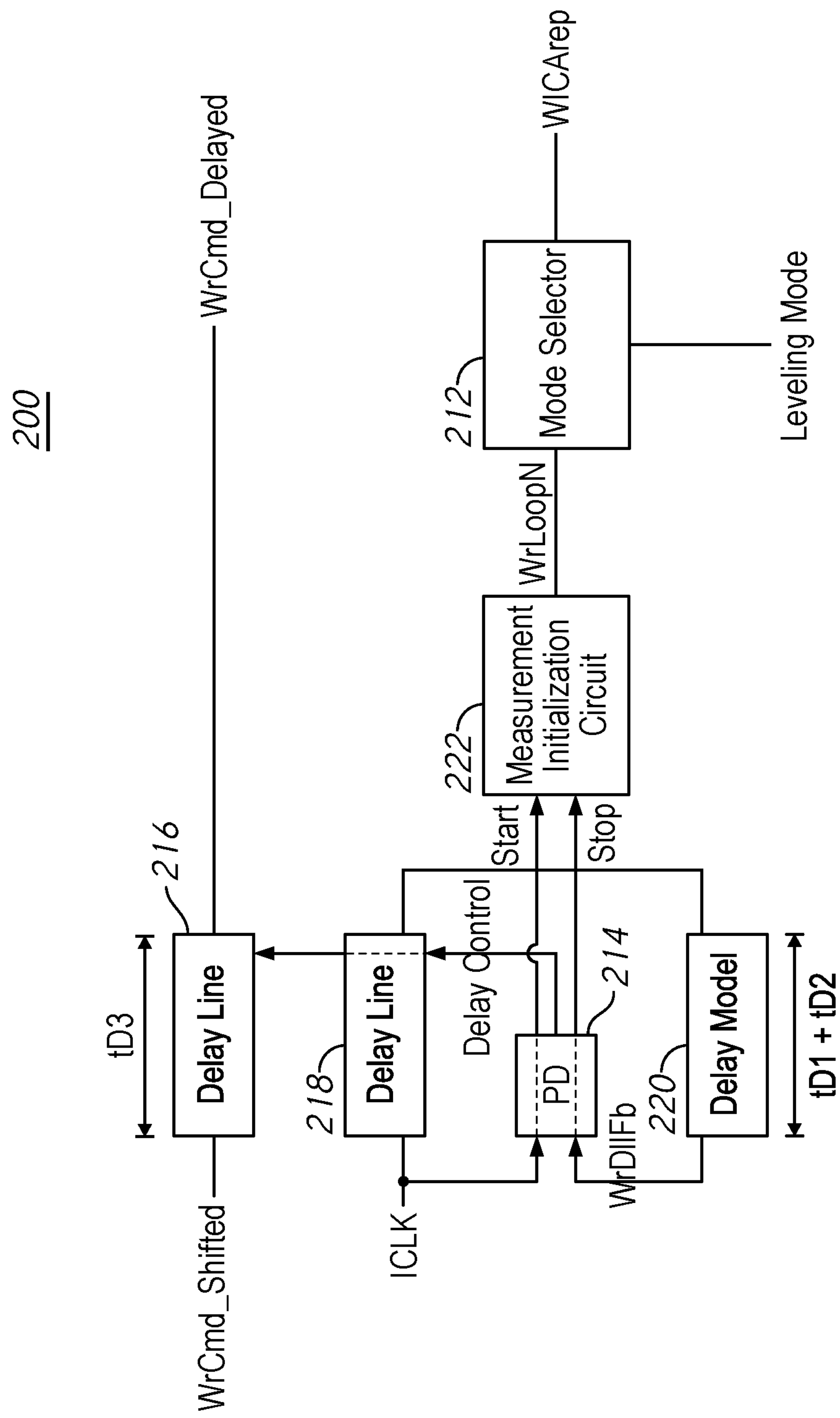
FIG. 2 is a block diagram of a write delay-locked loop, according to an embodiment of the present disclosure.

FIG. 2 is a block diagram of a write delay-locked loop 200, according to an embodiment of the present disclosure. The write delay-locked loop 200 may include a phase detector 214, delay lines 216 and 218, a delay model 220, a measurement initialization circuit 222, and a mode selector 212. The delay line 216 may receive a shifted write command signal WrCmd_Shifted that includes CAS write latency (CWL) adjustment (e.g., shift) from a write command signal (e.g., WrCmd in FIG. 3) from a command/address circuit (e.g., the command/address circuit 130). The delay line 216 may receive a delay control signal from the phase detector 214 and may further provide a shifted write command signal WrCmd_Shifted with a line delay as controlled by the delay control signal. The delay 216 has a propagation delay tD3, thus a total propagation delay (e.g., tFP in FIGS. 3, 5 and 7) of a write forward from an input node of a clock input circuit (e.g., the clock input circuit 135) to an output node of the write delay-locked loop 200 becomes a product of a clock period tCK and a number of cycles WrLoopN. The delay 216 may receive the shifted write command signal WrCmd_Shifted with the CWL adjustment with the line delay of the delay 216, and may provide a delayed write command WrCmd_Delayed.

The delay line 218 may receive the internal clock signal ICLK and the control signal from the phase detector 214. The delay line 218 may provide the internal clock signal ICLK with the line delay as controlled by the delay control signal to the delay model 220. The delay model 220 may represent a delay equivalent to a sum of propagation delays on a write forward path that is described later in details referring to FIG. 3. For example, the sum of the propagation delays include a propagation delay tD1 in a clock input circuit (e.g., the clock input circuit 135) and a propagation delay tD2 in the command/address circuit (e.g., the command/address circuit 130). The delay model 220 may receive the internal clock signal ICLK with the line delay and provide a feedback signal WrDllFb that is delayed by the sum of the propagation delays (tD1+tD2).

The phase detector 214 and the measurement initialization circuit 222 may receive the feedback signal WrDllFb and the internal clock signal ICLK. The phase detector 214 may detect a phase shift between the feedback signal WrDllFb and the internal clock signal ICLK, and provide the delay control signal to the delay lines 216 and 218 to reduce the phase shift. The measurement initialization circuit 222 may receive the internal clock signal ICLK at a start node and the feedback signal WrDllFb at a stop node. The measurement initialization circuit 222 may provide a number of cycles WrLoopN that indicates a number of cycles to propagate a signal in a write forward path that is described later in details referring to FIGS. 3, 5 and 7. In some embodiments, the measurement initialization circuit 222 may initially calculate the number of cycles WrLoopN when the write delay-locked loop 200 is reset. As described earlier, the phase detector 214 may provide the delay control signal to the delay lines 216 and 218 to control the delay lines 216 and 218. By controlling the delay lines 216 and 218, a total propagation time tFP of the write forward path from an input node of the clock input circuit to an output node of the write delay-locked loop 200 that provides a delayed write command WrCmd_Delayed becomes a product of a clock period tCK and the number of cycles WrLoopN.

The mode selector 212 may adjust the number of cycles WrLoopN to provide a number of cycles WICArep from the write delay-locked loop 200 based on a current write leveling mode that is either an external write leveling mode (EWL) or an internal write leveling mode (IWL). Adjustments of the cycles WICArep according to the current write leveling mode will be described in details in later referring to FIGS. 3-8.

Figure 3:
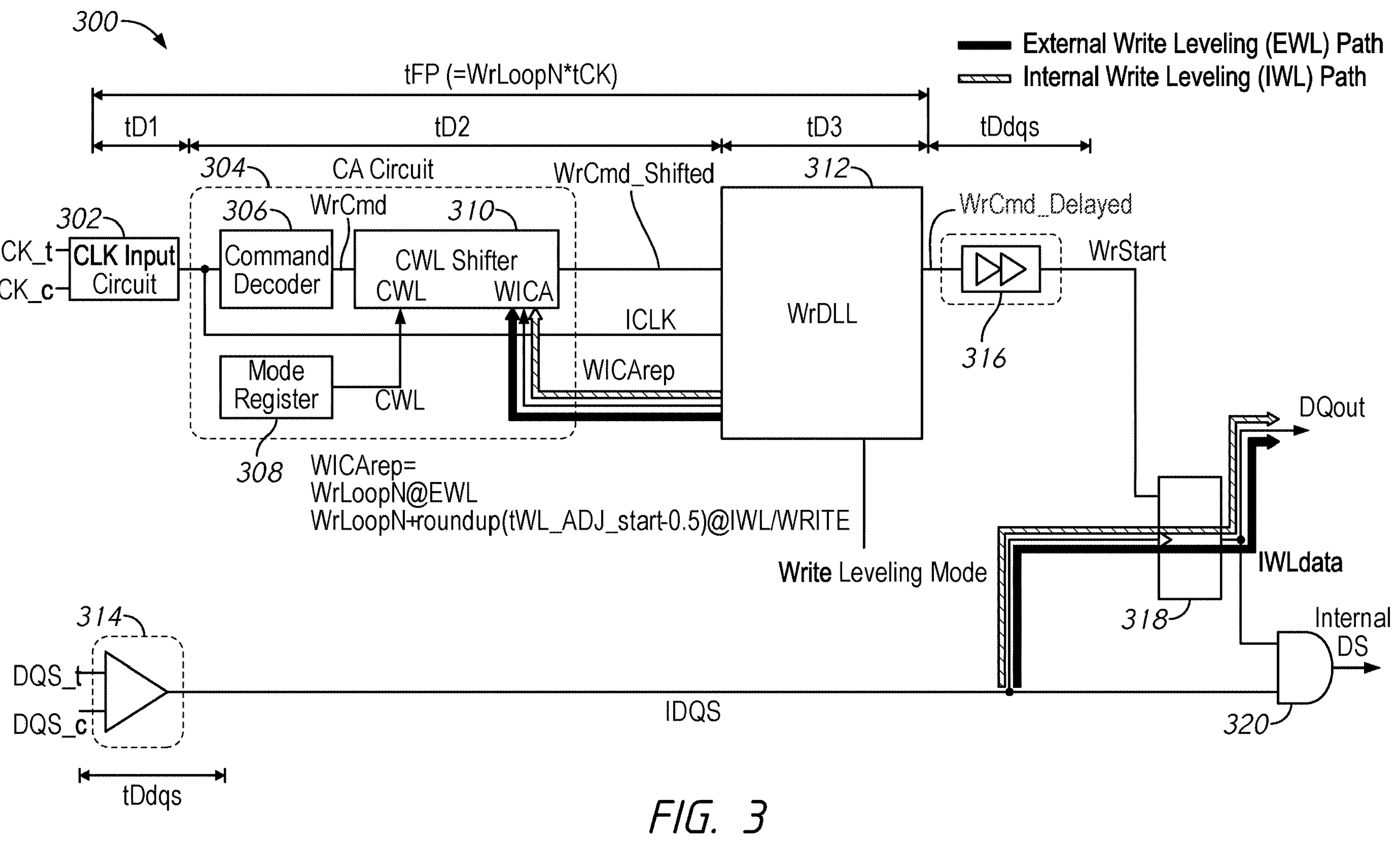
FIG. 3 is a schematic diagram of a write path, according to an embodiment of the present disclosure.

FIG. 3 is a schematic diagram of a write path 300, according to an embodiment of the present disclosure. The write path 300 includes a write forward path including a clock input circuit 302, a command/address circuit 304 and a write delay-locked loop 312.

The clock input circuit 302 may provide an internal clock signal ICLK. The clock input circuit 302 may have a propagation delay tD1 from a reception of the input clock signal CK_t to a transmission of the internal clock signal ICLK. In some embodiments, the clock input circuit 302 may include a clock input buffer without a divider. The clock input buffer may receive an input clock signal CK_t and its complementary signal CK_c, and may further provide the input clock signal CK_t as the internal clock signal ICLK. In some embodiments, the clock input circuit 302 may include a clock input buffer and a divider (not shown). The clock input buffer may receive an input clock signal CK_t and its complementary signal CK_c, and may further provide the input clock signal CK_t. The divider may receive the clock signal CK_t and may further provide the internal clock signal ICLK that has a half frequency of the input clock signal CK_t.

In some embodiments, command/address circuit 304 may be the command/address circuit 130 in FIG. 1. The command/address circuit 304 may include a command decoder 306, a CWL shifter 310 and a mode register 308. In some embodiments, the command decoder 306 may be the command decoder 134 in FIG. 1. The command decoder 306 may receive command signals from a command/address input circuit, such as the command/address input circuit 131 of FIG. 1. The command decoder 306 may receive the internal clock signal ICLK from the clock input circuit 302. The command decoder 306 may decode the command signals, and may further provide a write command signal WrCmd in an active state to the CWL shifter 310, if the command signals are indicative of a write operation. The command decoder 306 may have a propagation delay tD2 between a reception of the internal clocks signal ICLK and a transmission of the write command signal WrCmd based on a decoding process. In some embodiments, a delay (not shown) may be coupled in parallel to the command decoder 306 between the clock input circuit 302 and the CWL shifter 310. The delay may provide the internal clock signal ICLK with a delay equivalent to the propagation delay tD2 to the write delay-locked loop 312 and the CWL shifter 310 in place of the internal clock signal ICLK.

The CWL shifter 310 may receive the write command signal WrCmd from the command decoder 306. The CWL shifter 310 may further receive the internal clock signal ICLK. The CWL shifter 310 may further receive a CAS write latency (CWL). In some embodiments, the CWL may be provided by the mode register 308 preprogrammed by an external memory controller (not shown). In some embodiments, a number of bits representing the CWL may be seven. The CWL shifter 310 may further receive a number of cycles WICArep from the write delay-locked loop 312 at write leveling internal cycle alignment (WICA) nodes. In some embodiments, a number of bits representing the number of cycles WICArep may be four. The CWL shifter 310 may provide a shifted write command signal WrCmd_Shifted that is the write command signal WrCmd with time adjustment (e.g., shift) based on a product of one cycle tCK and a number of cycles that is a difference of the CWL and the number of cycles WICArep. The time adjustment may be performed in a manner that the CWL shifter 310 advances the received write command signal WrCmd by the number of cycles WICArep with regards to the CWL to provide the shifted write command signal WrCmd_Shifted.

In some embodiments, the write delay-locked loop 312 may include the write delay-locked loop 200. The write delay-locked loop 312 may receive the shifted write command signal WrCmd_Shifted from the CWL shifter 310. The write delay-locked loop 312 may further receive the internal clock signal ICLK. The write delay-locked loop 312 may provide a delayed write command WrCmd_Delayed as described referring to FIG. 2 from its output node.

The write path 300 may also include a DQS delay model 316 coupled to the output node of the write delay-locked loop 312. The DQS delay model 316 has a delay tDdqs equivalent to a propagation delay of a DQS input buffer 314 on a DQS path. The DQS delay model 316 may receive the delayed write command WrCmd_Delayed and provide a write command start signal WrStart that is delayed by the tDdqs from the delayed write command WrCmd_Delayed. The write path 300 may further include a write path output latch 318. The DQS input buffer 314 may receive a data strobe signal DQS_t and its complementary signal DQS_c, and provide an internal DQS signal IDQS.

The write path output latch 318 may receive the write command start signal WrStart and the internal DQS signal at a data input node and a clock input node, respectively. The write path output latch 318 may provide an internal write leveling data signal IWLdata to a data queue output node DQout responsive to the write command start signal WrStart and the internal DQS signal IDQS.

The DQS path also includes a logic circuit 320 that may receive the internal DQS signal IDQS and the internal write leveling data signal IWLdata. In some embodiments, the logic circuit 320 may be a logic AND gate. The logic circuit 320 may provide an internal data strobe signal Internal DS that is a combined signal of the internal DQS signal IDQS and the internal write leveling data signal IWLdata.

The number of cycles WICArep may be configured in a manner that a total propagation time tFP of the write forward path from the input node of the clock input circuit 302 to the output node of the write delay-locked loop 312 becomes a product of a clock period tCK and the number of cycles WrLoopN that is described referring to FIG. 2. In some embodiments, the write delay-locked loop 312 may receive a current write leveling mode. The write delay-locked loop 312 may provide the number of cycles WICArep by adjusting the number of cycles WrLoopN based on a current write leveling mode that is either an external write leveling mode (EWL) or an internal write leveling mode (IWL).

Figure 4:
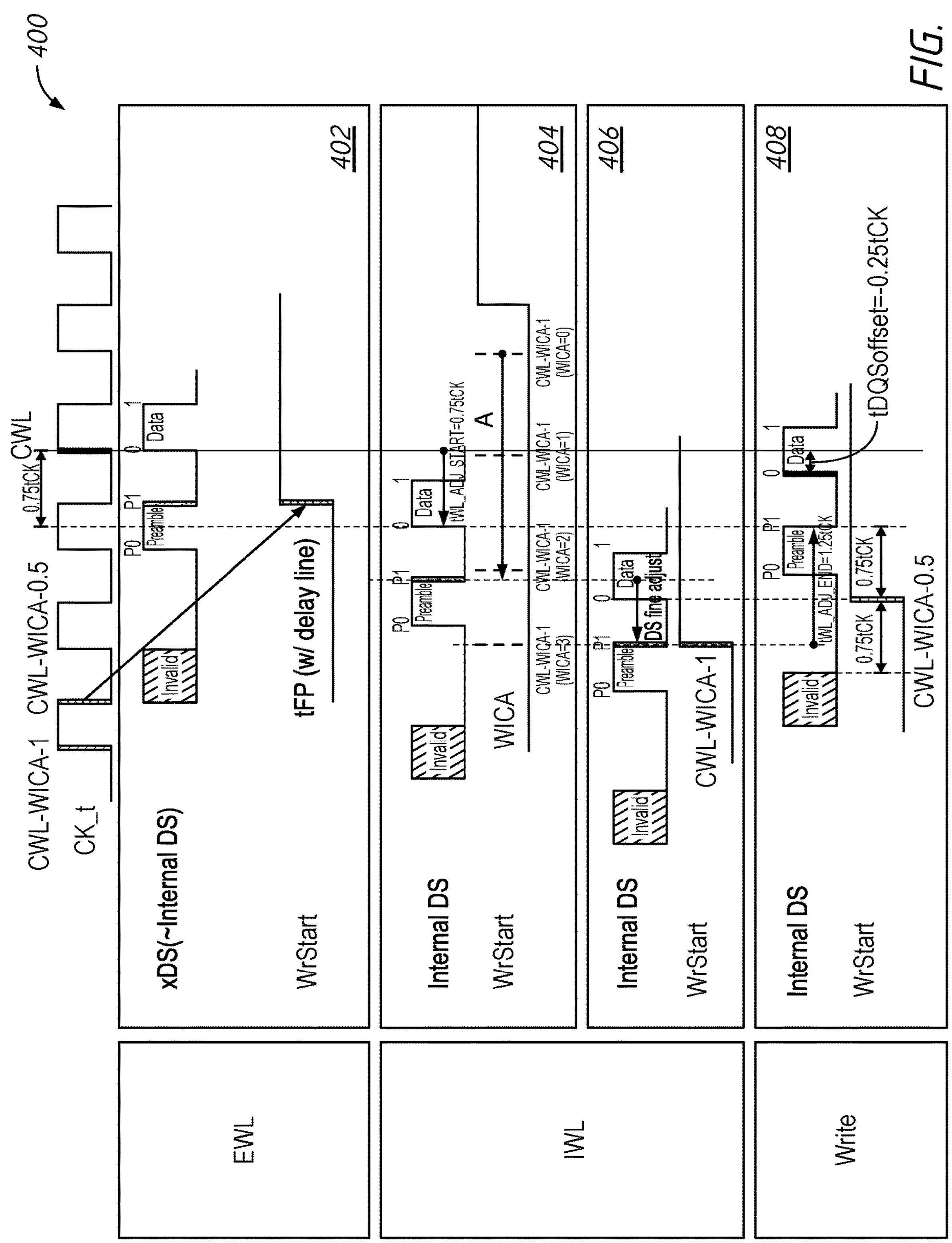
FIG. 4 is a timing diagram of signals during external and internal write levelings, according to the embodiment of the present disclosure.

FIG. 4 is a timing diagram 400 of signals during external and internal write levelings, according to the embodiment of the present disclosure. A panel 402 represents a timing relationship between the write command start signal WrStart and an external data strobe signal xDS that is similar to the internal data strobe signal Internal DS when the current write leveling mode is an external write leveling mode (EWL). The write delay-locked loop 312 may provide the number of cycles WICArep that is the number of cycles WrLoopN responsive to the current write leveling mode being the external write leveling mode (EWL). A rising edge of the clock signal CK_t representing a cycle CWL may be synchronized with a rising edge of the external data strobe signal xDS that indicates a time 0 to start data transmission. When the total propagation time tFP with the write delay-locked loop 312 is a duration of two clock periods 2tCK, a rising edge of the write command start signal WrStart may be synchronized with a falling edge of a preamble at time P1 that is half a period before the time 0 that may be delayed from a falling edge of the clock signal CK_t at a cycle (CWL-WICA−0.5), when the number of cycles WICArep is provided to the CWL shifter 310 as a WICA value.

A panel 404 represents a timing relationship between the write command start signal WrStart and the internal data strobe signal Internal DS when the current write leveling mode enters an internal write leveling mode (IWL). The WICArep value may be adjusted, depending on a write preamble between the data strobe signals DQS_t and DQS_c. For example, in FIG. 4, when the write preamble is two, the write delay-locked loop 312 may provide the number of cycles WICArep that is configured as a sum of the number of cycles WrLoopN and roundup(WL_ADJ_START−0.5). The time tWL_ADJ_START represents an offset that a memory controller applies to timings of the data strobe signals DQS_t and DQS_c while switching from the EWL mode to the IWL mode. In the example of the panel 404, the time tWL_ADJ_START is 0.75 times of the clock period (0.75tCK). Thus, the number of cycles WICArep is computed as {2+round up (0.75−0.5)}=3. Thus, the WICA value=3 is provided to the CWL shifter 310.

A panel 406 represents a timing relationship between the write command start signal WrStart and the internal data strobe signal Internal DS while conducting a data strobe fine adjustment in the internal write leveling mode (IWL). The internal data strobe signal Internal DS has been shifted by 0.75tCK earlier and a falling edge of the preamble at time P1 is synchronized with the rising edge of the write command start signal WrStart that corresponds to a cycle (CWL-WICA−1). The data strobe fine adjustment value DS fine adjust is computed as (−WICA+A) where A is computed as {tFP+t(WL_ADJ_START−0.5)}. Thus, the data strobe fine adjustment value DS fine adjust is computed as (−3+2+0.75−0.5)tCK=−0.75tCK.

A panel 408 represents a timing relationship between the write command start signal WrStart and the internal data strobe signal Internal DS after the internal write leveling mode (IWL). WICA training starts with an offset that is set to “0”. By the time the internal write leveling ends at the time tWL_ADJ_END, that is 1.25tCK, the rising edge of the internal data strobe signal Internal DS that corresponds to the time 0 to start data transmission is 0.25tCK earlier than the initial time 0 in the panel 402. Thus, a time offset of the data strobe signal tDQSoffset is controlled to −0.25tCK.

As described earlier, FIG. 4 illustrated a case when the write preamble is two and the time tWL_ADJ_START is 0.75tCK. When the write preamble is two and the time tWL_ADJ_START is −0.75tCK, the time offset of the data strobe signal tDQSoffset is controlled to −0.25tCK. When the write preamble is three and the time tWL_ADJ_START is −1.25tCK, the time offset of the data strobe signal tDQSoffset is controlled to 0.25tCK. When the write preamble is four and the time tWL_ADJ_START is −2.25tCK, the time offset of the data strobe signal tDQSoffset is controlled to 0.25tCK.

Because the number of cycles WICArep may be configured in a manner that a total propagation time tFP of the write forward path from the input node of the clock input circuit 302 to the output node of the write delay-locked loop 312 becomes a product of a clock period tCK and the number of cycles WrLoopN. Depending on the write preamble and the time tWL_ADJ_START, the time offset of the data strobe signal tDQSoffset can be controlled to −0.25tCK or 0.25tCK.

A write delay-locked loop provides WICA information for write level internal cycle alignment between a clock signal and a DQS signal. A time offset of the data strobe signal tDQSoffset is controlled within a desirable range, thus alignment between a clock signal and a DQS signal in a write path may be improved without the WICA information programmed by an external memory controller on a mode register.

Figure 5:
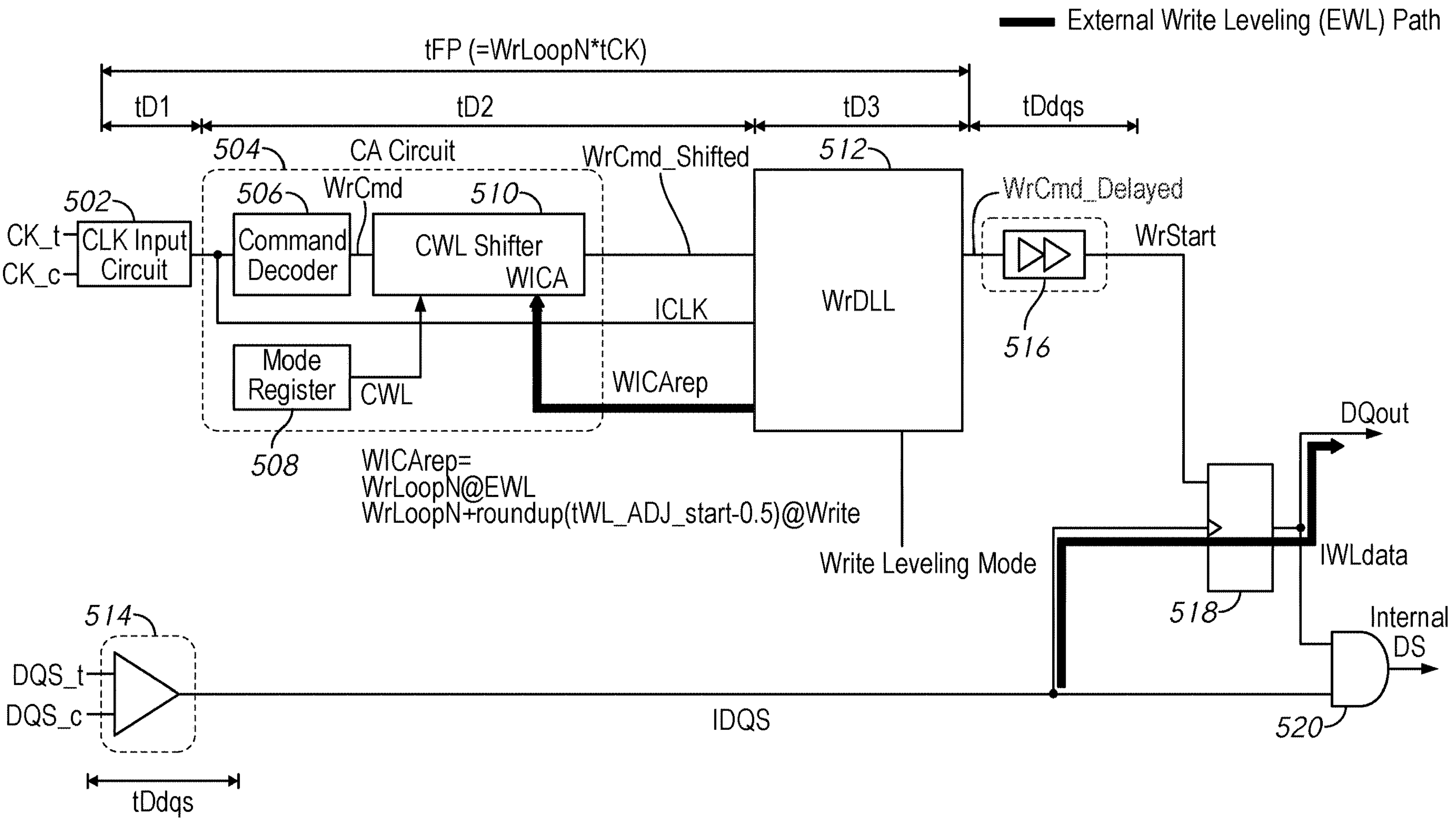
FIG. 5 is a schematic diagram of a write path, according to an embodiment of the present disclosure.

In some embodiments, an internal write leveling may not be performed after an external write leveling. FIG. 5 is a schematic diagram of a write path 500, according to an embodiment of the present disclosure. The write path 500 includes a write forward path including a clock input circuit 502, a command/address circuit 504 and a write delay-locked loop 512.

The clock input circuit 502 may provide an internal clock signal ICLK. The clock input circuit 502 may have a propagation delay tD1 from a reception of the input clock signal CK_t to a transmission of the internal clock signal ICLK. In some embodiments, the clock input circuit 502 may include a clock input buffer without a divider. The clock input buffer may receive an input clock signal CK_t and its complementary signal CK_c, and may further provide the input clock signal CK_t as the internal clock signal ICLK. In some embodiments, the clock input circuit 502 may include a clock input buffer and a divider (not shown). The clock input buffer may receive an input clock signal CK_t and its complementary signal CK_c, and may further provide the input clock signal CK_t. The divider may receive the clock signal CK_t and may further provide the internal clock signal ICLK that has a half frequency of the input clock signal CK_t.

In some embodiments, command/address circuit 504 may be the command/address circuit 130 in FIG. 1. The command/address circuit 504 may include a command decoder 506, a CWL shifter 510 and a mode register 508. In some embodiments, the command decoder 506 may be the command decoder 134 in FIG. 1. The command decoder 506 may receive the internal clock signal ICLK and command signals from a command/address input circuit, such as the command/address input circuit 131 of FIG. 1. The command decoder 506 may decode the command signals, and may further provide a write command signal WrCmd in an active state to the CWL shifter 510, if the command signals are indicative of a write command. The command decoder 506 may have a propagation delay tD2 between a reception of the internal clocks signal ICLK and a transmission of the write command signal WrCmd based on a decoding process. In some embodiments, a delay (not shown) may be coupled in parallel to the command decoder 506 between the clock input circuit 502 and the CWL shifter 510. The delay may provide the internal clock signal ICLK with a delay equivalent to the propagation delay tD2 to the write delay-locked loop 512 and the CWL shifter 510 in place of the internal clock signal ICLK.

The CWL shifter 510 may receive the write command signal WrCmd from the command decoder 506. The CWL shifter 510 may further receive the internal clock signal ICLK. The CWL shifter 510 may further receive a CAS write latency (CWL), that is a number of clock cycles equivalent to a propagation delay tFP in a write forward path from a reception of clock signals by the clock input circuit 502 to a transmission of a signal provided by the write delay-locked loop 512. In some embodiments, the CWL may be provided by the mode register 508 preprogrammed by an external memory controller (not shown). In some embodiments, a number of bits representing the CWL may be seven. The CWL shifter 510 may further receive a number of cycles WICArep from the write delay-locked loop 512 at write leveling internal cycle alignment (WICA) nodes. In some embodiments, a number of bits representing the number of cycles WICArep may be four. The CWL shifter 510 may provide a shifted write command signal WrCmd_Shifted that is the write command signal WrCmd with time adjustment (e.g., shift) based on a product of one cycle tCK and a number of cycles that is a difference of the CWL and the number of cycles WICArep. The time adjustment may be performed in a manner that the CWL shifter 510 advances the received write command signal WrCmd by the number of cycles WICArep with regards to the CWL to provide the shifted write command signal WrCmd_Shifted.

In some embodiments, the write delay-locked loop 512 may include the write delay-locked loop 200. The write delay-locked loop 512 may receive the shifted write command signal WrCmd_Shifted from the CWL shifter 510. The write delay-locked loop 512 may further receive the internal clock signal ICLK. The write delay-locked loop 512 may provide a delayed write command WrCmd_Delayed as described referring to FIG. 2 from its output node.

The write path 500 may also include a DQS delay model 516 coupled to the output node of the write delay-locked loop 512. The DQS delay model 516 has a delay tDdqs equivalent to a propagation delay of a DQS input buffer 514 on a DQS path. The DQS delay model 516 may receive the delayed write command WrCmd_Delayed and provide a write command start signal WrStart that is delayed by the tDdqs from the delayed write command WrCmd_Delayed. The write path 500 may further include a write path output latch 518. The DQS input buffer 514 may receive a data strobe signal DQS_t and its complementary signal DQS_c, and provide an internal DQS signal IDQS.

The write path output latch 518 may receive the write command start signal WrStart and the internal DQS signal at a data input node and a clock input node, respectively. The write path output latch 518 may provide an internal write leveling data signal IWLdata to a data queue output node DQout responsive to the write command start signal WrStart and the internal DQS signal IDQS.

The DQS path also includes a logic circuit 520 that may receive the internal DQS signal IDQS and the internal write leveling data signal IWLdata. In some embodiments, the logic circuit 520 may be a logic AND gate. The logic circuit 520 may provide an internal data strobe signal Internal DS that is a combined signal of the internal DQS signal IDQS and the internal write leveling data signal IWLdata.

The number of cycles WICArep may be configured in a manner that a total propagation time tFP of the write forward path from the input node of the clock input circuit 502 to the output node of the write delay-locked loop 512 becomes a product of a clock period tCK and the number of cycles WrLoopN that is described referring to FIG. 2. In some embodiments, the write delay-locked loop 512 may receive a current write leveling mode. The write delay-locked loop 512 may provide the number of cycles WICArep by adjusting the number of cycles WrLoopN when a current write leveling mode is an external write leveling mode (EWL).

Figure 6:
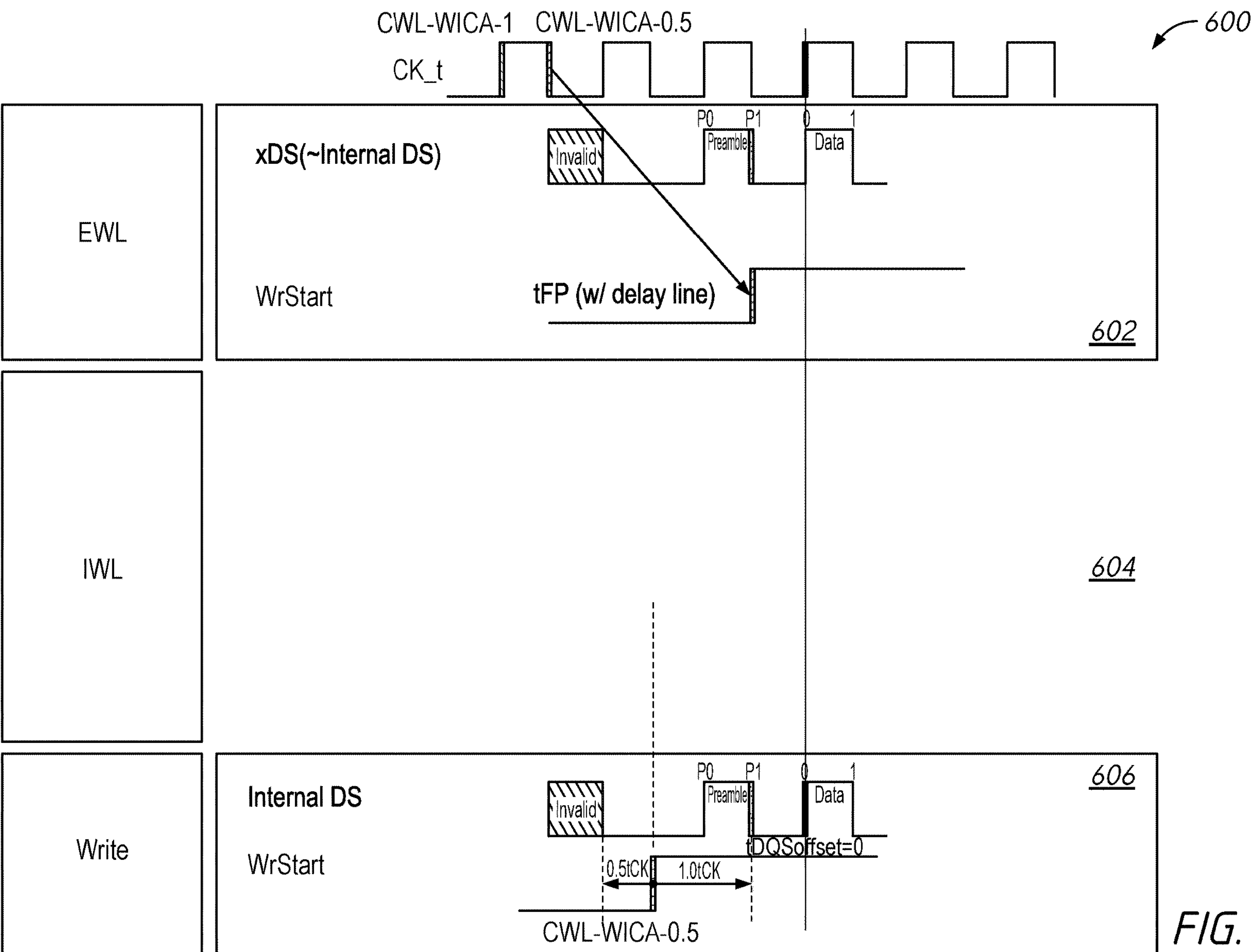
FIG. 6 is a timing diagram of signals during an internal write leveling, according to the embodiment of the present disclosure.

FIG. 6 is a timing diagram 600 of signals during external write leveling, according to the embodiment of the present disclosure. A panel 602 represents a timing relationship between the write command start signal WrStart and an external data strobe signal xDS that is similar to the internal data strobe signal Internal DS when the current write leveling mode is an external write leveling mode (EWL). The write delay-locked loop 512 may provide the number of cycles WICArep that is the number of cycles WrLoopN responsive to the current write leveling mode being the external write leveling mode (EWL). A rising edge of the clock signal CK_t representing a cycle CWL may be synchronized with a rising edge of the external data strobe signal xDS that indicates a time 0 to start data transmission. When the total propagation time tFP with the write delay-locked loop 512 is a duration of two clock periods 2tCK, a rising edge of the write command start signal WrStart may be synchronized with a falling edge of a preamble at time P1 that is half a period before the time 0 that may be delayed from a falling edge of the clock signal CK_t at a cycle (CWL-WICA−0.5), when the number of cycles WICArep is provided to the CWL shifter 510 as a WICA value. A panel 604 represents that an internal write leveling is skipped.

A panel 606 represents a timing relationship between the write command start signal WrStart and the internal data strobe signal Internal DS after the external write leveling mode (EWL). The write command start signal WrStart has been advanced by one clock cycle (1.0tCK) earlier by the number of cycles WICArep provided in the EWL, and a falling edge of the preamble P1 of the internal data strobe signal Internal DS occurs one clock cycle after a rising edge of the write command start signal WrStart that corresponds to a cycle (CWL-WICA−0.5). The rising edge of the internal data strobe signal Internal DS that corresponds to the time 0 to start data transmission has not been adjusted. Thus, a time offset of the data strobe signal tDQSoffset is maintained as zero. Because the number of cycles WICArep may be configured in a manner that a total propagation time tFP of the write forward path from the input node of the clock input circuit 502 to the output node of the write delay-locked loop 512 becomes a product of a clock period tCK and the number of cycles WrLoopN, the time offset of the data strobe signal tDQSoffset can be maintained zero. As described earlier, FIG. 6 illustrated a case when the write preamble is two. The rising edge of the write command start signal WrStart advances a data strobe signal DQS by 0.25tCK (−0.25tCK) after applying the WICA value. This timing is sufficient to receive the write command without performing the internal write leveling.

A write delay-locked loop provides WICA information for write level internal cycle alignment between a clock signal and a DQS signal during an external write leveling. A time offset of the data strobe signal tDQSoffset is maintained. Alignment between a clock signal and a DQS signal in a write path may be acceptable without performing the internal write leveling.

Figure 7:
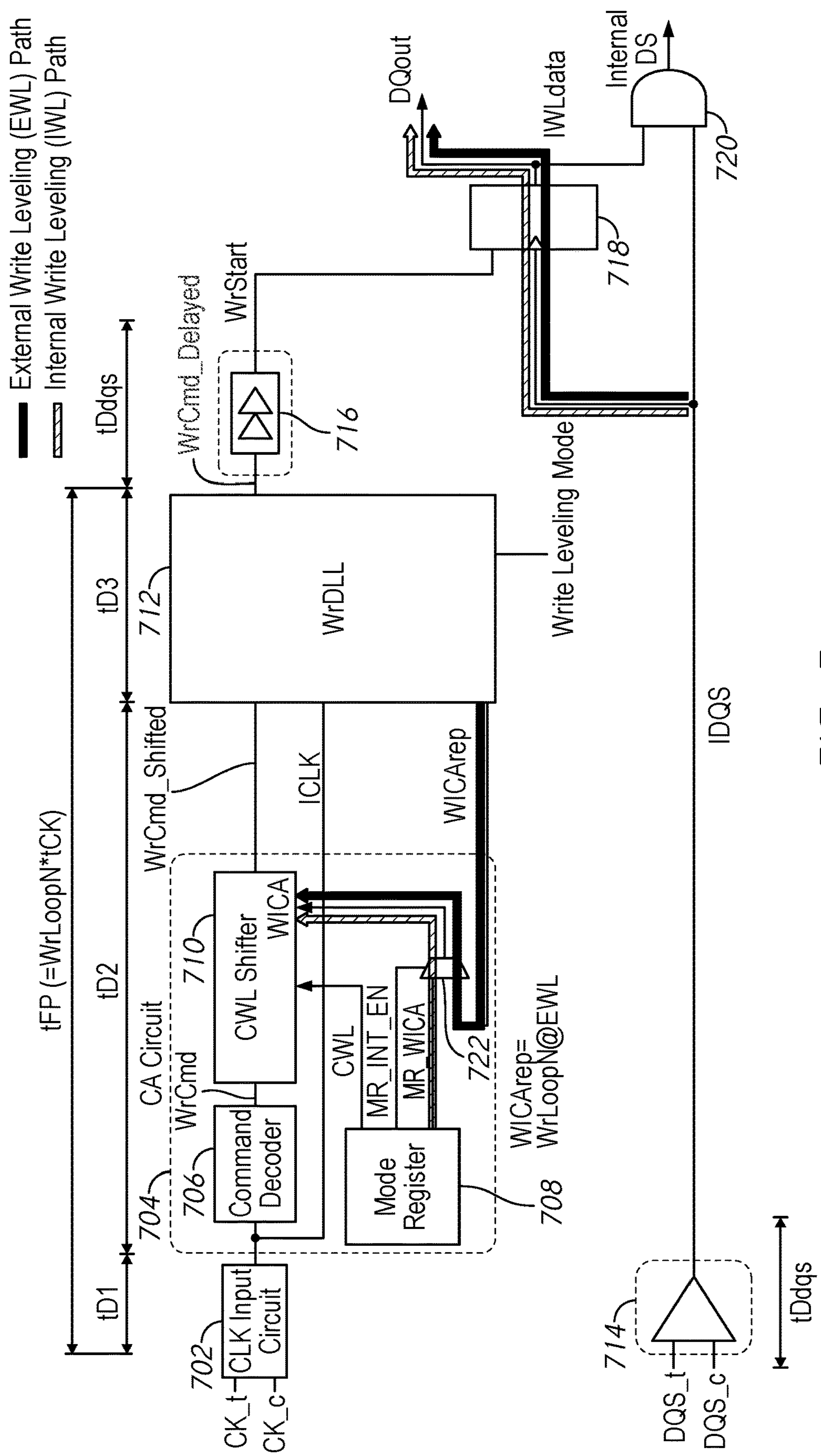
FIG. 7 is a schematic diagram of a write path, according to an embodiment of the present disclosure.

FIG. 7 is a schematic diagram of a write path 700, according to an embodiment of the present disclosure. The write path 700 includes a write forward path including a clock input circuit 702, a command/address circuit 704 and a write delay-locked loop 712.

The clock input circuit 702 may provide an internal clock signal ICLK. The clock input circuit 702 may have a propagation delay tD1 from a reception of the input clock signal CK_t to a transmission of the internal clock signal ICLK. In some embodiments, the clock input circuit 702 may include a clock input buffer without a divider. The clock input buffer may receive an input clock signal CK_t and its complementary signal CK_c, and may further provide the input clock signal CK_t as the internal clock signal ICLK. In some embodiments, the clock input circuit 702 may include a clock input buffer and a divider (not shown). The clock input buffer may receive an input clock signal CK_t and its complementary signal CK_c, and may further provide the input clock signal CK_t. The divider may receive the clock signal CK_t and may further provide the internal clock signal ICLK that has a half frequency of the input clock signal CK_t.

In some embodiments, command/address circuit 704 may be the command/address circuit 130 in FIG. 1. The command/address circuit 704 may include a command decoder 706, a CWL shifter 710, a mode register 708 and a selector 722. In some embodiments, the command decoder 706 may be the command decoder 134 in FIG. 1. The command decoder 706 may receive the internal clock signal ICLK and command signals from a command/address input circuit, such as the command/address input circuit 131 of FIG. 1. The command decoder 706 may decode the command signals, and may further provide a write command signal WrCmd in an active state to the CWL shifter 710, if the command signals are indicative of a write operation. The command decoder 706 may have a propagation delay tD2 between a reception of the internal clocks signal ICLK and a transmission of the write command signal WrCmd based on a decoding process. In some embodiments, a delay (not shown) may be coupled in parallel to the command decoder 706 between the clock input circuit 702 and the CWL shifter 710. The delay may provide the internal clock signal ICLK with a delay equivalent to the propagation delay tD2 to the write delay-locked loop 712 and the CWL shifter 710 in place of the internal clock signal ICLK.

The CWL shifter 710 may receive the write command signal WrCmd from the command decoder 706. The CWL shifter 710 may further receive the internal clock signal ICLK. The CWL shifter 710 may further receive a CAS write latency (CWL), that is a number of clock cycles equivalent to a propagation delay tFP in a write forward path from a reception of clock signals by the clock input circuit 702 to a transmission of a signal provided by the write delay-locked loop 712. In some embodiments, the CWL may be provided by a mode register 708 preprogrammed by an external memory controller (not shown). In some embodiments, a number of bits representing the CWL may be seven.

The CWL shifter 710 may further receive a number of cycles represented by a WICA value from the write delay-locked loop 712 at write leveling internal cycle alignment (WICA) nodes. The selector 722 may provide the WICA value to the WICA nodes of the CWL shifter. In some embodiments, a number of bits representing the WICA value may be four. The mode register 708 may provide a control signal MR_INT_EN. The control signal MR_INT_EN instructs the selector 722 to provide either a number of cycles WICArep from the write delay-locked loop 712 during an external write leveling mode or a number of cycles MR_WICA from the mode register 708 during an internal write leveling mode as the WICA value. In some embodiments, the number of cycles MR_WICA may be preprogrammed by an external memory controller (not shown) on the mode register 708.

The CWL shifter 710 may provide a shifted write command signal WrCmd_Shifted that is the write command signal WrCmd with time adjustment (e.g., shift) based on a product of one cycle tCK and a number of cycles that is a difference of the CWL and the number of cycles WICA. The time adjustment may be performed in a manner that the CWL shifter 710 advances the received write command signal WrCmd by the number of cycles WICA with regards to the CWL to provide the shifted write command signal WrCmd_Shifted.

In some embodiments, the write delay-locked loop 712 may include the write delay-locked loop 200. The write delay-locked loop 712 may receive the shifted write command signal WrCmd_Shifted from the CWL shifter 710. The write delay-locked loop 712 may further receive the internal clock signal ICLK. The write delay-locked loop 712 may provide a delayed write command WrCmd_Delayed as described referring to FIG. 2 from its output node.

The write path 700 may also include a DQS delay model 716 coupled to the output node of the write delay-locked loop 712. The DQS delay model 716 has a delay tDdqs equivalent to a propagation delay of a DQS input buffer 714 on a DQS path. The DQS delay model 716 may receive the delayed write command WrCmd_Delayed and provide a write command start signal WrStart that is delayed by the tDdqs from the delayed write command WrCmd_Delayed. The write path 700 may further include a write path output latch 718. The DQS input buffer 714 may receive a data strobe signal DQS_t and its complementary signal DQS_c, and provide an internal DQS signal IDQS.

The write path output latch 718 may receive the write command start signal WrStart and the internal DQS signal at a data input node and a clock input node, respectively. The write path output latch 718 may provide an internal write leveling data signal IWLdata to a data queue output node DQout responsive to the write command start signal WrStart and the internal DQS signal IDQS.

The DQS path also includes a logic circuit 720 that may receive the internal DQS signal IDQS and the internal write leveling data signal IWLdata. In some embodiments, the logic circuit 720 may be a logic AND gate. The logic circuit 720 may provide an internal data strobe signal Internal DS that is a combined signal of the internal DQS signal IDQS and the internal write leveling data signal IWLdata.

The number of cycles WICArep may be configured in a manner that a total propagation time tFP of the write forward path from the input node of the clock input circuit 702 to the output node of the write delay-locked loop 712 becomes a product of a clock period tCK and the number of cycles WrLoopN that is described referring to FIG. 2. In some embodiments, the write delay-locked loop 712 may receive a current write leveling mode. The write delay-locked loop 712 may provide the number of cycles WICArep by adjusting the number of cycles WrLoopN when a current write leveling mode is an external write leveling mode (EWL).

Figure 8:
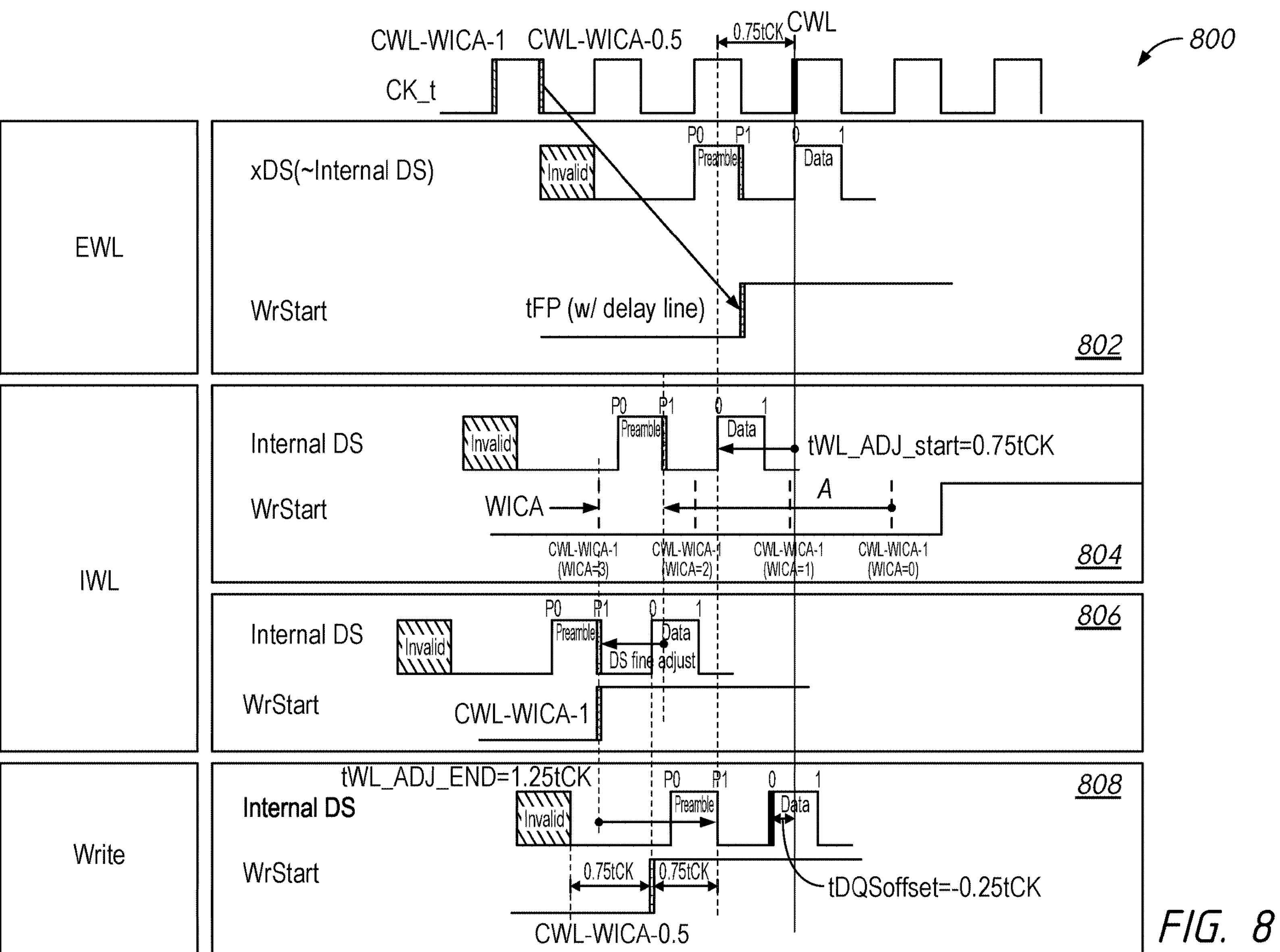
FIG. 8 is a timing diagram of signals during external and internal write levelings, according to the embodiment of the present disclosure.

FIG. 8 is a timing diagram 800 of signals during external and internal write levelings, according to the embodiment of the present disclosure. A panel 802 represents a timing relationship between the write command start signal WrStart and an external data strobe signal xDS that is similar to the internal data strobe signal Internal DS when the current write leveling mode is an external write leveling mode (EWL). The write delay-locked loop 712 may provide the number of cycles WICArep that is the number of cycles WrLoopN responsive to the current write leveling mode being the external write leveling mode (EWL). A rising edge of the clock signal CK_t representing a cycle CWL may be synchronized with a rising edge of the external data strobe signal xDS that indicates a time 0 to start data transmission. When the total propagation time tFP with the write delay-locked loop 712 is a duration of two clock periods 2tCK, a rising edge of the write command start signal WrStart may be synchronized with a falling edge of a preamble at time P1 that is half a period before the time 0 that may be delayed from a falling edge of the clock signal CK_t at a cycle (CWL-WICA−0.5), when the selector 722 provides the number of cycles WICArep from the write delay-locked loop 712 to the CWL shifter 710 as a WICA value.

A panel 804 represents a timing relationship between the write command start signal WrStart and the internal data strobe signal Internal DS when the current write leveling mode enters an internal write leveling mode (IWL). The selector 722 provides a number of cycles MR_WICA as a WICA value to the CWL shifter 710. For example, in FIG. 8, when the write preamble is two, the selector 722 may provide the number of cycles MR_WICA (e.g., three) from the mode register 708. The time tWL_ADJ_START represents an offset that a memory controller applies to timings of the data strobe signals DQS_t and DQS_c while switching from the EWL mode to the IWL mode. In the example of the panel 804, the time tWL_ADJ_START is 0.75 times of the clock period (0.75tCK). Thus, the number of cycles MR_WICA is approximated as {2+round up (0.75−0.5)}=3. Thus, WICA value=3 is provided to the CWL shifter 710.

A panel 806 represents a timing relationship between the write command start signal WrStart and the internal data strobe signal Internal DS while conducting a data strobe fine adjustment in the internal write leveling mode (IWL). The internal data strobe signal Internal DS has been advanced by 0.75tCK and a falling edge of the preamble P1 is synchronized with the rising edge of the write command start signal WrStart that corresponds to a cycle (CWL-WICA−1). The data strobe fine adjustment value DS fine adjust is computed as (−WICA+A) where A is computed as {tFP+t(WL_ADJ_START−0.5)}. Thus, the data strobe fine adjustment value DS fine adjust is computed as (−3+2+0.75−0.5)tCK=−0.75tCK.

A panel 808 represents a timing relationship between the write command start signal WrStart and the internal data strobe signal Internal DS after the internal write leveling mode (IWL). WICA training starts with an offset that is set to "0". By the time the internal write leveling ends at the time tWL_ADJ_END, that is 1.25tCK, the rising edge of the internal data strobe signal Internal DS that corresponds to the time 0 to start data transmission is 0.25tCK earlier than the initial time 0 in the panel 802. Thus, a time offset of the data strobe signal tDQSoffset is controlled to −0.25tCK.

As described earlier, FIG. 8 illustrated a case when the write preamble is two and the time tWL_ADJ_START is 0.75tCK. When the write preamble is two and the time tWL_ADJ_START is −0.75tCK, the time offset of the data strobe signal tDQSoffset is controlled to −0.25tCK. When the write preamble is three and the time tWL_ADJ_START is −1.25tCK, the time offset of the data strobe signal tDQSoffset is controlled to 0.25tCK. When the write preamble is four and the time tWL_ADJ_START is −2.25tCK, the time offset of the data strobe signal tDQSoffset is controlled to 0.25tCK.

Because the number of cycles WICArep may be configured in a manner that a total propagation time tFP of the write forward path from the input node of the clock input circuit 702 to the output node of the write delay-locked loop 712 becomes a product of a clock period tCK and the number of cycles WrLoopN, regardless of the write preamble and the time tWL_ADJ_START, the time offset of the data strobe signal tDQSoffset can be controlled between −0.25tCK and 0.25tCK.

A write delay-locked loop provides WICA information for write level internal cycle alignment between a clock signal and a DQS signal during an external write leveling and a mode register provide WICA information programmed by a memory controller during an internal write leveling. A time offset of the data strobe signal tDQSoffset is controlled within a desirable range, thus alignment between a clock signal and a DQS signal in a write path may be improved.

Various embodiments of apparatus and methods for write level internal alignment between a clock signal and a DQS signal in a write forward path have been described. A write forward path includes a CWL shifter and a write delay-locked loop coupled to the CWL shifter. In some embodiments, the write delay-locked loop provides WICA information while providing a write start signal with a delay controlled based on a phase difference between the clock signal and a feedback signal from a replica circuit. In some embodiments, the write delay-locked loop provides different WICA values between an external write leveling and an internal write leveling. In some embodiments, the write delay-locked loop provides a WICA value in an external write leveling and the write forward path does not perform an internal write leveling. In some embodiments, the write delay-locked loop provides a WICA value in an external write leveling and a mode register provides a WICA value programmed by a memory controller in an internal write leveling. By actively controlling a delay in the write forward path by the write delay-locked loop in a manner that a total propagation time tFP of a write forward path from an input node of the clock input circuit to an output node of the write delay-locked loop becomes an integral multiple of a clock period, a time offset of the data strobe signal tDQSoffset is controlled within a desirable range, thus alignment between a clock signal and a DQS signal in a write path may be improved.

Although various embodiments have been disclosed, it will be understood by those skilled in the art that the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

What is claimed is:

1. An apparatus comprising:

a clock input circuit configured to receive an external clock signal and further configured to provide an internal clock signal;

a command decoder configured to receive command signals and the internal clock signal, and further configured to provide a write command signal in an active state responsive to the command signals indicative of a write operation;

a write latency shifter configured to receive the write command signal, a latency value and a write leveling internal cycle alignment (WICA) value, the write latency shifter configured to adjust timing of the write command signal responsive to the latency value and the WICA value, and further configured to provide a shifted write command signal; and a write delay-locked loop comprising a delay line configured to receive the shifted write command signal and further configured to provide a delayed write command signal, wherein the write delay-locked loop is configured to provide the WICA value to set a propagation time from the clock input circuit to the write delay-locked loop, wherein the delay-locked loop is configured to provide the WICA value to the write latency shifter.

2. An apparatus comprising:

a clock input circuit configured to receive an external clock signal and further configured to provide an internal clock signal;

a command decoder configured to receive command signals and the internal clock signal, and further configured to provide a write command signal in an active state responsive to the command signals indicative of a write operation;

a write latency shifter configured to receive the write command signal, a latency value and a write leveling internal cycle alignment (WICA) value, the write latency shifter configured to adjust timing of the write command signal responsive to the latency value and the WICA value, and further configured to provide a shifted write command signal; and a write delay-locked loop comprising a delay line configured to receive the shifted write command signal and further configured to provide a delayed write command signal, wherein the write delay-locked loop is configured to provide the WICA value to set a propagation time from the clock input circuit to the write delay-locked loop, wherein the propagation time is set to be an integral multiple of a period of the external clock signal.

3. An apparatus comprising:

a clock input circuit configured to receive an external clock signal and further configured to provide an internal clock signal;

a command decoder configured to receive command signals and the internal clock signal, and further configured to provide a write command signal in an active state responsive to the command signals indicative of a write operation;

a write latency shifter configured to receive the write command signal, a latency value and a write leveling internal cycle alignment (WICA) value, the write latency shifter configured to adjust timing of the write command signal responsive to the latency value and the WICA value, and further configured to provide a shifted write command signal; and a write delay-locked loop comprising a delay line configured to receive the shifted write command signal and further configured to provide a delayed write command signal, wherein the write delay-locked loop is configured to provide the WICA value to set a propagation time from the clock input circuit to the write delay-locked loop, wherein the write delay-locked loop is configured to receive a write leveling mode indicative of either an external write leveling mode or an internal write leveling mode, and further configured to provide the WICA value when the write leveling mode is indicative of the external write leveling mode.

4. The apparatus of claim 3, configured to complete write leveling by performing the external write leveling.

5. The apparatus of claim 3, wherein the WICA value is a first WICA value, and wherein the write delay-locked loop is configured to provide a second WICA value during the internal write leveling mode.

6. The apparatus of claim 5, wherein the second WICA value during the internal write leveling mode is based on the first WICA value and a round up of an offset to a timing of a data strobe signal while switching from the external write leveling mode to the internal write leveling mode.

7. The apparatus of claim 3, wherein the WICA value is a first WICA value, the apparatus further comprising:

a mode register configured to store a second WICA value;

a selector configured to provide the first WICA value in the external write leveling mode and further configured to provide the second WICA value in the internal write leveling mode.

8. The apparatus of claim 7, wherein the mode register is configured to provide a control signal that instructs the selector to provide either the first WICA value from the write delay-locked loop during the external write leveling mode or the second WICA value from the mode register during the internal write leveling mode.

9. An apparatus comprising:

a clock input circuit configured to receive an external clock signal and further configured to provide an internal clock signal;

a command decoder configured to receive command signals and the internal clock signal, and further configured to provide a write command signal in an active state responsive to the command signals indicative of a write operation;

a write latency shifter configured to receive the write command signal, a latency value and a write leveling internal cycle alignment (WICA) value, the write latency shifter configured to adjust timing of the write command signal responsive to the latency value and the WICA value, and further configured to provide a shifted write command signal; and a write delay-locked loop comprising a delay line configured to receive the shifted write command signal and further configured to provide a delayed write command signal, wherein the write delay-locked loop is configured to provide the WICA value to set a propagation time from the clock input circuit to the write delay-locked loop, wherein the delay line is a first delay line, wherein the write delay-locked loop further comprises:

a second delay line configured to receive the internal clock signal and further configured to provide a delayed internal clock signal;

a delay model having a model propagation delay equivalent to a sum of a first propagation delay in the clock input circuit and a second propagation delay in the command decoder and the write latency shifter, the delay model configured to receive the delayed internal clock signal and further configured to provide a feedback signal; and a phase detector configured to receive the internal clock signal and the feedback signal, configured to detect a phase shift between the feedback signal and the internal clock signal, and further configured to provide a delay control signal to the first and second delay lines to reduce the phase shift.

10. The apparatus of claim 9, wherein the write delay-locked loop further comprises a measurement initialization circuit that is configured to receive the internal clock signal at a start node and the feedback signal at a stop node, and further configured to provide the WICA value.

11. The apparatus of claim 10, wherein the measurement initialization circuit is configured to calculate the WICA value when the write delay-locked loop is reset.

12. An apparatus comprising:

a write forward path including:

a command decoder configured to receive an internal clock signal and command signals and further configured to provide a write command signal in an active state responsive to command signals indicative of a write operation;

a write latency shifter configured to receive the write command signal, a latency value and a WICA value, the write latency shifter configured to adjust timing of the write command signal responsive to the latency value and the WICA value, and further configured to provide a shifted write command signal; and a write delay-locked loop comprising a delay line configured to receive the shifted write command signal and further configured to provide a delayed write command signal, wherein the write delay-locked loop is configured to provide the write latency shifter with the WICA value to set a propagation time of the write forward path.

13. The apparatus of claim 12, wherein the propagation time is set to be an integral multiple of a period of the internal clock signal.

14. The apparatus of claim 13, wherein the delay line is a first delay line, wherein the write delay-locked loop further comprises:

a second delay line configured to receive the internal clock signal and further configured to provide a delayed internal clock signal;

a delay model having a model propagation delay, wherein a sum of the model propagation delay and a propagation delay of the second delay line is equivalent to a propagation delay of the write forward path, the delay model configured to receive the delayed internal clock signal and further configured to provide a feedback signal; and a measurement initialization circuit configured to receive the internal clock signal at a start node and the feedback signal at a stop node, and further configured to set the WICA value.

15. The apparatus of claim 14, wherein the measurement initialization circuit is configured to calculate the WICA value when the write delay-locked loop is reset.

16. The apparatus of claim 14, wherein the write delay-locked loop is configured to receive a current write leveling mode and further configured to provide the WICA value if the current write leveling mode is an external write leveling mode.

17. The apparatus of claim 16, wherein the WICA value is a first WICA value, and wherein the write delay-locked loop is configured to provide a second WICA value if the current write leveling mode is an internal write leveling mode.

18. The apparatus of claim 17, wherein the second WICA value during the internal write leveling mode is based on the first WICA value and a round up of an offset to a timing of a data strobe signal while switching from the external write leveling mode to the internal write leveling mode.

* * * * *